United States Patent
Wu et al.

(10) Patent No.: US 8,937,347 B2
(45) Date of Patent: *Jan. 20, 2015

(54) NON-VOLATILE MEMORY

(71) Applicant: MACRONIX International Co., Ltd., Hsinchu (TW)

(72) Inventors: Guan-Wei Wu, Hsinchu (TW); I-Chen Yang, Hsinchu (TW); Yao-Wen Chang, Hsinchu (TW); Tao-Cheng Lu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/266,079

(22) Filed: Apr. 30, 2014

(65) Prior Publication Data

US 2014/0231900 A1    Aug. 21, 2014

Related U.S. Application Data

(63) Continuation of application No. 13/707,426, filed on Dec. 6, 2012, now Pat. No. 8,748,963.

(51) Int. Cl.
*H01L 21/4763* (2006.01)
*H01L 29/792* (2006.01)
*H01L 29/66* (2006.01)

(52) U.S. Cl.
CPC ........ *H01L 29/792* (2013.01); *H01L 29/66833* (2013.01)
USPC .................................. 257/314; 257/E29.309

(58) Field of Classification Search
CPC ...................... H01L 29/66636; H01L 29/7834
USPC .................................................... 257/E29.309
See application file for complete search history.

(56) References Cited

U.S. PATENT DOCUMENTS 8,748,963 B1 *    6/2014   Wu et al. ........................ 257/314

* cited by examiner

*Primary Examiner* — Telly Green
*Assistant Examiner* — Paul Patton
(74) *Attorney, Agent, or Firm* — J.C. Patents

(57) ABSTRACT

A non-volatile memory is provided. The non-volatile memory includes a oxide and polysilicon stack structure and charge storage layers. The oxide and polysilicon stack structure is disposed on a substrate. There are recesses in the substrate at two sides of the oxide and polysilicon stack structure. The oxide and polysilicon stack structure includes an oxide layer and a polysilicon layer. The oxide layer is disposed on the substrate, wherein there is an interface between the oxide layer and the substrate. The polysilicon layer is disposed on the oxide layer. The charge storage layers are disposed in the recesses and extend to a side wall of the oxide and polysilicon stack structure, and a top surface of each of the charge storage layers is higher than the interface.

6 Claims, 2 Drawing Sheets

NON-VOLATILE MEMORY

CROSS-REFERENCE TO RELATED APPLICATION

This application is a continuation application of and claims the priority benefit of a prior application Ser. No. 13/707,426, filed on Dec. 16, 2012, now pending. The entirety of each of the above-mentioned patent applications is hereby incorporated by reference herein and made a part of this specification.

BACKGROUND OF THE INVENTION

1. Technical Field

The disclosure relates to a non-volatile memory and a manufacturing method thereof, and particularly relates to a non-volatile memory that prevents a second bit effect and a manufacturing method thereof 2. Related Art The non-volatile memory is characterized by maintaining the stored data even when the power is down, and has thus become a mandatory device in many electronic products for providing normal operation of the electronic products when booted. In particular, flash memory is a type of non-volatile memory that allows multiple times of programming, reading and erasing operations. With these advantages, flash memory has become one of the most widely adopted memory devices for personal computers and electronic equipments.

Nitride-based flash memory is a common non-volatile memory nowadays. In a nitride-based flash memory, a two-bit data is stored by using a charge trapping structure formed of an oxide-nitride-oxide layer (the well-known ONO layer). Generally speaking, the two-bit data may be respectively stored at the left side (left bit) and the right side (right bit) of the nitride layer in the charge trapping structure.

However, there is a second bit effect in the nitride-based flash memory. Namely, a reading operation to the left bit is influenced by the right bit, whereas a reading operation to the right bit is influenced by the left bit. In addition, as the memory size reduces, the channel length is reduced accordingly, rendering an even more significant influence of the second bit effect. Therefore, the operation window and device performance of the memory are influenced.

SUMMARY

An embodiment of the disclosure provides a non-volatile memory adapted for preventing the second bit effect during operation.

An embodiment of the disclosure additionally provides a method of manufacturing a non-volatile memory adapted for manufacturing a non-volatile memory with a larger operation window.

An embodiment of the disclosure provides a non-volatile memory including a oxide and polysilicon stack structure and charge storage layers. The oxide and polysilicon stack structure is disposed on a substrate. There are recesses in the substrate at two sides of the oxide and polysilicon stack structure. The oxide and polysilicon stack structure includes an oxide layer and a polysilicon layer. The oxide layer is disposed on the substrate, wherein there is an interface between the oxide layer and the substrate. The polysilicon layer is disposed on the oxide layer. The charge storage layers are disposed in the recesses and extend to a side wall of the oxide and polysilicon stack structure, and a top surface of each of the charge storage layers is higher than the interface.

According to the non-volatile memory in an embodiment of the disclosure, a thickness of the charge storage layers is between 100 Å to 150 Å, for example.

According to the non-volatile memory in an embodiment of the disclosure, the recesses have a tilting sidewall, for example.

According to the non-volatile memory in an embodiment of the disclosure, a material of the charge storage layers is nitride or a high dielectric constant material, for example.

According to the non-volatile memory in an embodiment of the disclosure, dielectric layers disposed on the charge storage layers are further included, wherein a top surface of each of the dielectric layers is coplanar with a top surface of the oxide and polysilicon stack structure.

According to the non-volatile memory in an embodiment of the disclosure, a conductive layer disposed on the dielectric layers and the oxide and polysilicon stack structure is further included.

An embodiment of the disclosure also provides a method of manufacturing a non-volatile memory, wherein a gate structure is formed on a substrate. The gate structure includes a gate dielectric layer and a gate. The gate dielectric layer is located on the substrate, wherein there is an interface between the gate dielectric layer and the substrate. The gate is located on the gate dielectric layer. Then recesses are formed in the substrate at two sides of the gate structure. Afterwards, a first dielectric layer is Rained on the substrate and the gate structure. Then doped regions are formed in the substrate around the recesses. Afterwards, charge storage layers are thinned in the recesses, wherein a top surface of each of the charge storage layer is higher than the interface.

According to the method of manufacturing the non-volatile memory in an embodiment of the disclosure, the distance is between 0.005 μm and 0.01 μm, for example.

According to the method of manufacturing the non-volatile memory in an embodiment of the disclosure, a thickness of the charge storage layers is between 100 Å to 150 Å, for example.

According to the method of manufacturing the non-volatile memory in an embodiment of the disclosure, the recesses have a tilting sidewall, for example.

According to the method of manufacturing the non-volatile memory in an embodiment of the disclosure, a material of the charge storage layers is nitride or a high dielectric constant material, for example.

According to the method of manufacturing the non-volatile memory in an embodiment of the disclosure, forming second dielectric layers on the charge storage layers is further included after the charge storage layers are formed.

According to the method of manufacturing the non-volatile memory in an embodiment of the disclosure, performing a planarization process to remove a portion of the first dielectric layer and a portion of the second dielectric layers until the gate is exposed is further included after the second dielectric layers are formed.

According to the method of manufacturing the non-volatile memory in an embodiment of the disclosure, forming a conductive layer on the second dielectric layers and the gate structure is further included after the planarization process is performed.

According to the method of manufacturing the non-volatile memory in an embodiment of the disclosure, the doped regions are kept a distance from the interface, each of the recesses has a bottom surface and at least a sidewall, and each of the doped regions is formed in the substrate under the bottom surface and surrounds a part of the sidewall, for example.

In view of the foregoing, in the non-volatile memory in the embodiments of the disclosure, the charge storage layers storing charges are respectively disposed at the two opposite sides of the gate structure, such that the channel length of memory increases to avoid the second bit effect during operation, and the operation window increases as well.

It should be noted that the descriptions above and hereinafter are only exemplary only, instead of serving as limitations of the disclosure.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1A:
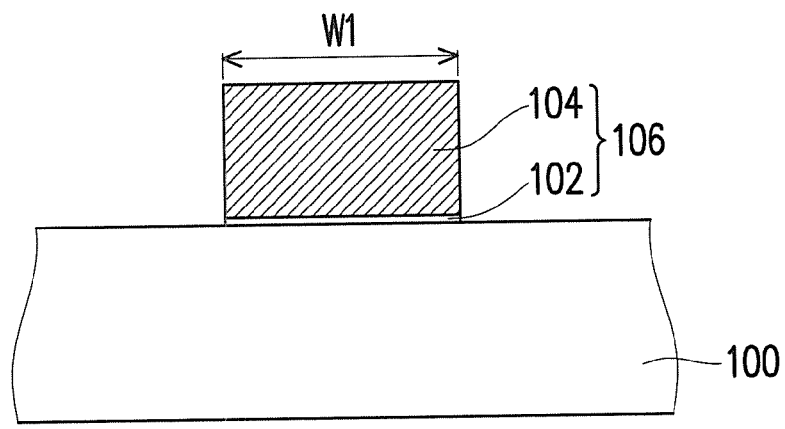
FIGS. 1A through 1D are cross-sectional views illustrating a process of manufacturing a non-volatile memory according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

FIGS. 1A through 1D are cross-sectional views illustrating a process of manufacturing a non-volatile memory according to an embodiment of the disclosure. First, referring to FIG. 1A, a substrate 100 is provided. The substrate 100 is, for example, a silicon substrate, or a silicon-on-insulator (SOI) substrate. Then, a gate dielectric material layer (not shown) and a gate material layer (now shown) are formed in sequence on the substrate 100. The gate dielectric material layer is, for example, an oxide layer with a thickness between, for example, 170 Å to 190 Å, and is formed by, for example, a thermal oxidation process or a chemical vapor deposition process. The gate material layer is, for example, a polysilicon layer, formed by a chemical vapor deposition process. Then the gate material layer and the gate dielectric material layer are patterned to form a gate 104 and a gate dielectric layer 102. A width W1 of the gate 104 is, for example, between 0.05 μm to 0.1 μm the gate dielectric layer 102 and the gate 104 form a gate structure 104.

Figure 1B:
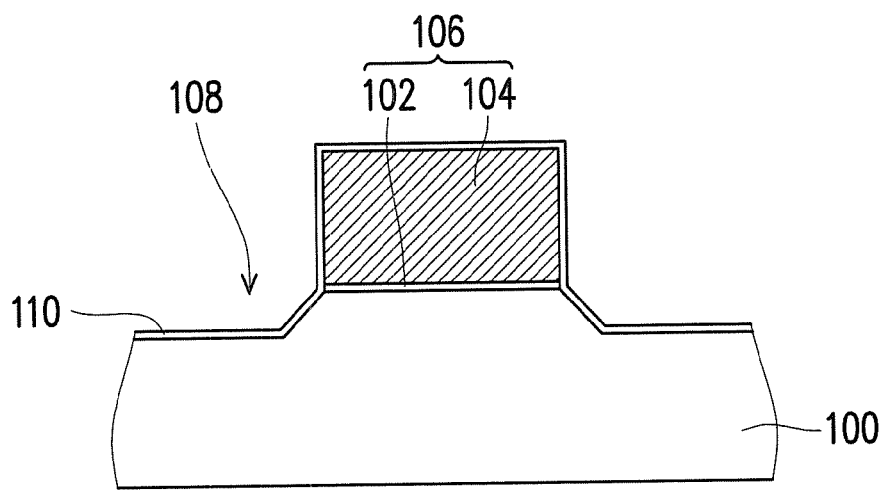

Afterwards, referring to FIG. 1B, recesses 108 are formed in the substrate 100 at two sides of the gate structure 106. The recesses 108 are formed by, for example, performing an anisotropic etching process to remove a portion of the substrate 100. In this embodiment, the recesses 108 have a tilting sidewall. However, the disclosure is not limited thereto. In other embodiments, the recesses 108 may also have a vertical sidewall. Then, a dielectric layer 110 is formed on the substrate 100 and the gate structure 106. The dielectric layer 110 is, for example, an oxide layer with a thickness between, for example, 50 Å and 100 Å, and formed by, for example, a thermal oxidation process or a chemical vapor deposition process.

Figure 1C:
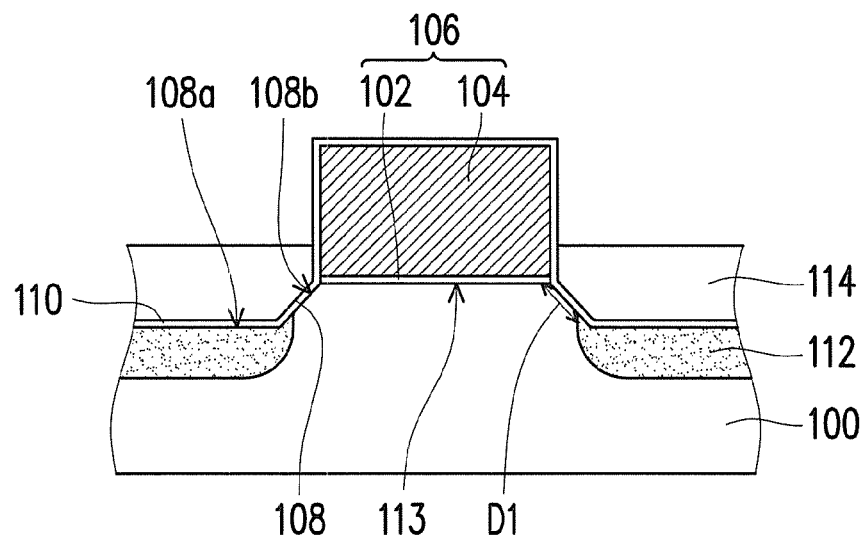

Then, referring to FIG. 1C, doped regions 112 are formed in the substrate 100 around the recesses 108. Specifically, each of the recesses 108 has a bottom surface 108a and at least a sidewall 108b, and each of the doped regions 112 is formed in the substrate 100 under the bottom surface 108a and surrounds a part of the sidewall 108b. The doped regions 112 are formed by performing an ion implantation process, for example. A depth of the doped regions 112 is, for example, between 0.05 μm to 0.09 μm. It should be noted that an interface 113 is between the gate dielectric layer 102 and the substrate 100, and the doped regions 112 do not contact the interface 113. Namely, there is a distance D1 between each of the doped regions 112 and the interface 113. The distance D1 is, for example, between 0.005 μm to 0.01 μm. The doped regions 112 at the two sides of the gate structure 106 respectively serve as a source region and a drain region of a non-volatile memory. Then, charge storage layers 114 are formed in the recesses 108 to complete manufacture of a non-volatile memory 10 of this embodiment. The dielectric layer 110 disposed between the charge storage layers 114 and the substrate 100 serves as a tunneling dielectric layer. A top surface of each of the charge storage layers 114 is higher than the interface 113. A material of the charge storage layers 114 is, for example, nitride or a high dielectric constant material. A thickness of the charge storage layers 114 is, for example, between 100 Å to 150Å. The charge storage layer 114 is formed by depositing a charge storage material layer in the recesses 108, and then performing an etch-back process to remove a portion of the charge storage material layer.

Figure 1D:
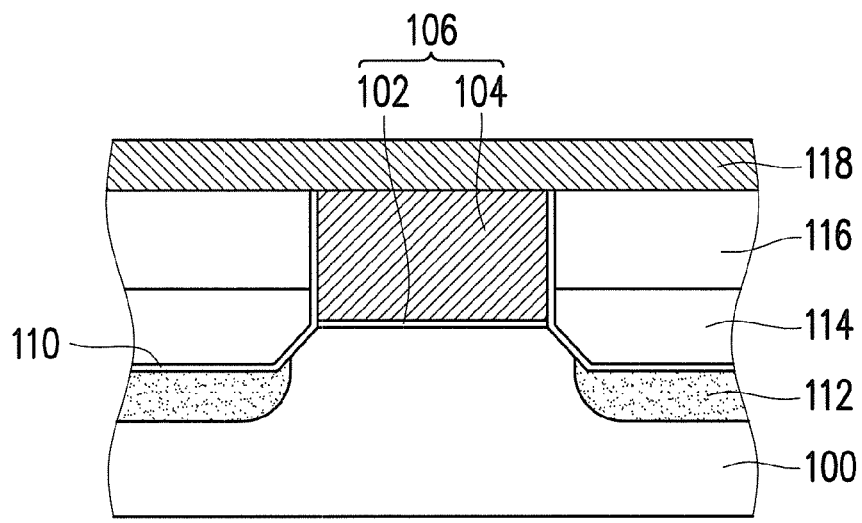

Then, referring to FIG. 1D, after forming the charge storage layers 114, dielectric layers 116 may be further formed on the charge storage layers 114. The dielectric layers 116 are oxide layers, for example. The dielectric layers 116 are, for example, formed by depositing a dielectric material layer on the charge storage layers 114 and then performing a planarization process to remove a portion of the dielectric layer 116 and the dielectric layers 110 until the gate 104 is exposed. Then, a conductive layer 118 is formed on the dielectric layers 116 and 110 and the gate structure 106. The conductive layer 118 is used to connect the gate 104 of the non-volatile memory 10 with a gate of an adjacent non-volatile memory (now shown). Namely, the conductive layer serves as a word line.

In the non-volatile memory 10, the charge storage layers 114 storing charges are respectively disposed at the two opposite sides of the gate structure 106, such that the second bit effect during operation caused by a short channel length of memory is effectively prevented and an operation window is increased.

In addition, in the non-volatile memory 10, the doped regions 112 and the interface 113 are kept the distance D1 instead of being connected to each other. Therefore, when the non-volatile memory 10 is operated, the charges may be effectively injected into the charge storage layers 114.

In addition, since the top surface of each of the charge storage layers 114 is higher than the interface 113, direct penetration of charges through the dielectric layer 110 into the dielectric layers 116 on the charge storage layers 114 may be prevented.

Although the disclosure has been described with reference to the above embodiments, it will be apparent to one of the ordinary skill in the art that modifications to the described embodiment may be made without departing from the spirit of the disclosure. Accordingly, the scope of the disclosure will be defined by the attached claims not by the above detailed descriptions.

What is claimed is:

1. A non-volatile memory, comprising:
an oxide and polysilicon stack structure, disposed on a substrate, wherein there are recesses in the substrate at two sides of the oxide and polysilicon stack structure, the oxide and polysilicon stack structure comprising:

an oxide layer, disposed on the substrate, wherein there is an interface between the oxide layer and the substrate; and a polysilicon layer, disposed on the oxide layer; and charge storage layers, disposed in the recesses and extend to a side wall of the oxide and polysilicon stack structure, and a top surface of each of the charge storage layers is higher than the interface.

2. The non-volatile memory as claimed in claim 1, wherein a thickness of the charge storage layers is between 100 Å to 150 Å.

3. The non-volatile memory as claimed in claim 1, wherein the recesses have a tilting sidewall.

4. The non-volatile memory as claimed in claim 1, wherein a material of the charge storage layers comprises nitride or a high dielectric constant material.

5. The non-volatile memory as claimed in claim 1, further comprising dielectric layers disposed on the charge storage layers, wherein a top surface of each of the dielectric layers is coplanar with a top surface of the oxide and polysilicon stack structure.

6. The non-volatile memory as claimed in claim 5, further comprising a conductive layer disposed on the dielectric layers and the oxide and polysilicon stack structure.

* * * * *